United States Patent
Choi et al.

(10) Patent No.: US 10,096,472 B2
(45) Date of Patent: Oct. 9, 2018

(54) SINGLE CRYSTAL RHOMBOHEDRAL EPITAXY OF SIGE ON SAPPHIRE AT 450° C.-500° C. SUBSTRATE TEMPERATURES

(71) Applicant: The United States of America as represented by the Administrator of the National Aeronautics and Space Administration, Washington, DC (US)

(72) Inventors: Sang Hyouk Choi, Poquoson, VA (US); Adam J. Duzik, Yorktown, VA (US)

(73) Assignee: The United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 15/386,592

(22) Filed: Dec. 21, 2016

(65) Prior Publication Data

US 2017/0178903 A1    Jun. 22, 2017

Related U.S. Application Data

(60) Provisional application No. 62/270,321, filed on Dec. 21, 2015, provisional application No. 62/299,772, filed on Feb. 25, 2016.

(51) Int. Cl.
| | |
|---|---|
| *H01L 21/02* | (2006.01) |
| *H01L 29/161* | (2006.01) |
| *C30B 29/20* | (2006.01) |
| *C30B 23/08* | (2006.01) |
| *C30B 23/06* | (2006.01) |
| *C30B 29/52* | (2006.01) |

(52) U.S. Cl.
CPC ...... *H01L 21/02532* (2013.01); *C30B 23/063* (2013.01); *C30B 23/08* (2013.01);
(Continued)

(58) Field of Classification Search
CPC ....... C30B 23/063; C30B 29/52; C30B 23/08; C30B 23/083; C30B 29/20;
(Continued)

(56) References Cited

U.S. PATENT DOCUMENTS

| | | |
|---|---|---|
| 5,250,818 A | 10/1993 | Saraswat et al. |
| 7,341,883 B2 | 3/2008 | Park et al. |

(Continued)

OTHER PUBLICATIONS

Cullis, a. G., Booker, G. R., "The epitaxial growth of silicon and germanium films on (111) silicon surfaces using UHV sublimation and evaporation techniques," J. Cryst. Growth 9, 132-138 (1971).

(Continued)

*Primary Examiner* — Jasmine Clark
(74) *Attorney, Agent, or Firm* — Jennifer L. Riley; Robin W. Edwards; Mark P. Dvorscak

(57) ABSTRACT

Various embodiments may provide a low temperature (i.e., less than 850° C.) method of Silicon-Germanium (SiGe) on sapphire ($Al_2O_3$) (SiGe/sapphire) growth that may produce a single crystal film with less thermal loading effort to the substrate than conventional high temperature (i.e., temperatures above 850° C.) methods. The various embodiments may alleviate the thermal loading requirement of the substrate, which in conventional high temperature (i.e., temperatures above 850° C.) methods had surface temperatures within the range of 850° C.-900° C. The various embodiments may provide a new thermal loading requirement of the sapphire substrate for growing single crystal SiGe on the sapphire substrate in the range of about 450° C. to about 500° C.

20 Claims, 11 Drawing Sheets

(52) U.S. Cl.
CPC .............. *C30B 29/20* (2013.01); *C30B 29/52* (2013.01); *H01L 21/0242* (2013.01); *H01L 21/02598* (2013.01); *H01L 29/161* (2013.01)

(58) Field of Classification Search
CPC ........... H01L 21/02667; H01L 21/0242; H01L 21/02532; H01L 21/02598; H01L 29/121; H01L 29/161; H01L 21/0245
See application file for complete search history.

(56) References Cited

U.S. PATENT DOCUMENTS

| | | |
|---|---|---|
| 7,906,358 B2 | 3/2011 | Park et al. |
| 8,226,767 B2 | 7/2012 | Park et al. |
| 2006/0049487 A1* | 3/2006 | Sato .................. H01L 21/02203 257/620 |

OTHER PUBLICATIONS

Park, Y., King, G. G., Choi, S. H., "Rhombohedral epitaxy of cubic SiGe on trigonal c-plane sapphire," J. Cryst. Growth 310(11), 2724-2731 (2008).

Glass, H. L., Appleby Woods, M. R., Buehnerkemper, M. L., D. L., Weismuller, T. P., "Control of microtwins in MOCVD of CdTe on sapphire," J. Cryst. Growth 128(1-4), 617-621 (1993).

Kasuga, M., Futami, H., Iba, Y., "Vapor phase epitaxy of CdTe on sapphire and GaAs," J. Cryst. Growth 115(1-4), 711-717 (1991).

* cited by examiner

US 10,096,472 B2

SINGLE CRYSTAL RHOMBOHEDRAL EPITAXY OF SIGE ON SAPPHIRE AT 450° C.-500° C. SUBSTRATE TEMPERATURES

CROSS REFERENCE TO RELATED APPLICATIONS

This application claims the benefit of priority to U.S. Provisional Application No. 62/270,321 filed on Dec. 21, 2015 titled "Single Crystal Rhombohedral Epitaxy of SiGe on Sapphire at 450 C-500 C Substrate Temperatures" and U.S. Provisional Application No. 62/299,772 filed on Feb. 25, 2016 titled "Single Crystal Rhombohedral Epitaxy of SiGe on Sapphire at 450 C-500 C Substrate Temperatures." The entire contents of both applications are hereby incorporated by reference in their entireties.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

Single crystal films are necessary for manufacturing commercially useful semiconductor devices, such as computer chips (CMOS transistors), solar cells, light emitting diodes (LEDs), and solid-state lasers. Silicon-Germanium (SiGe) possesses a large speed advantage over pure Silicon (Si), but is costly and difficult to produce by itself as a whole wafer for semiconductor device manufacturing. Since only the top approximately 200 nm to 300 nm thickness of epitaxial layer on a wafer are used in modern semiconductor chip manufacturing, an alternative to using pure Si exists. The alternative is to deposit a thin film of SiGe onto a less expensive substrate, such as a sapphire ($Al_2O_3$) substrate. Thin film deposition of SiGe on sapphire has been done successfully in the past with high temperatures (i.e., temperatures above 850° C.), long thermal load times, and long soak times of the substrate at a high temperature (i.e., temperatures above 850° C.), as well as the additional requirement of providing a pure Si layer to act as an intermediary anchoring element between the trigonal sapphire ($Al_2O_3$) crystal structure and the diamond cubic SiGe. While effective, these conventional high temperature (i.e., temperatures above 850° C.) methods for deposition of SiGe on sapphire are unusable for practical commercial mass production. These conventional high temperature (i.e., temperatures above 850° C.) methods also stress the production equipment extensively by high and long thermal loading and soaking requirements. Temperature ramp-up times to above 850° C. are very long for conventional high temperature (i.e., temperatures above 850° C.) methods because of the transparency of sapphire substrate, the thermal equilibrium of substrate takes a long time to establish until the temperatures of the substrate and the surrounding reach an equilibrium level, and the cool-down time to settle at SiGe growth temperatures adds to the production time.

BRIEF SUMMARY OF THE INVENTION

The various embodiments may provide a low temperature (i.e., less than 850° C.) method of Silicon-Germanium (SiGe) on sapphire ($Al_2O_3$) (SiGe/sapphire) growth that may produce a single crystal film with less thermal loading effort to the substrate than conventional high temperature (i.e., temperatures above 850° C.) methods. The various embodiments may alleviate the thermal loading requirement of the substrate, which in conventional high temperature (i.e., temperatures above 850° C.) methods had surface temperatures within the range of 850° C.-900° C. The various embodiments may provide a new thermal loading requirement of the sapphire substrate for growing single crystal SiGe on the sapphire substrate in the range of about 450° C. to about 500° C. The benefits of the various embodiments are substantial for cost and time savings and may result in the elimination of the time-consuming and costly high heating, long thermal soak times, and interfacial Si layer of conventional high temperature (i.e., temperatures above 850° C.) methods. In various embodiments, yield and throughput may be increased as time to production may be reduced from over 4 hours in conventional high temperature (i.e., temperatures above 850° C.) methods to less than about 1 hour in the various embodiment methods. Thus, various embodiments may enable the same quality of SiGe/sapphire to be produced with far less effort and time when compared to conventional high temperature (i.e., temperatures above 850° C.) methods, bringing SiGe/sapphire fabricated according to the various embodiments to within the realm of mass production.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION OF THE INVENTION

Figure 1:
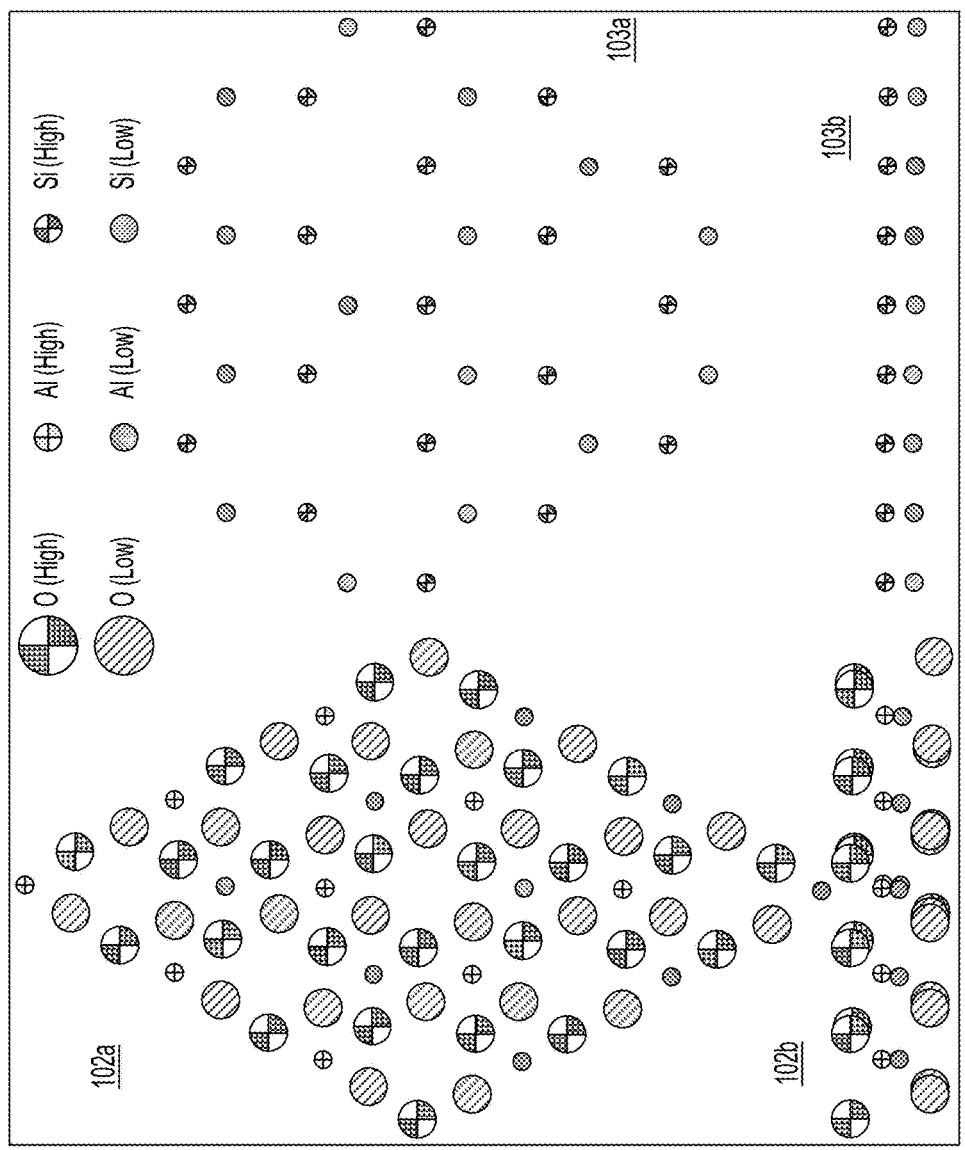
FIG. 1 illustrates top down and side views of a trigonal sapphire surface versus diamond cubic silicon.

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration." Any implementation described herein as "exemplary" is not necessarily to be construed as preferred or advantageous over other implementations.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Conventional semiconductor heteroepitaxy consists of thin film deposition of two different semiconductors with the same or similar crystal structures. Common examples are InAs on GaAs (both zinc-blende crystals) and GaN on sapphire (Wurtzite film on trigonal substrate). Single crystal Silicon-Germanium (SiGe) on sapphire ($Al_2O_3$) (referred to herein for ease of reference as "SiGe/sapphire") epitaxy requires the Si and Ge atoms bond to the sapphire surface correctly by forming a crystalline structure with lattice-matched into the trigonal structure of sapphire. The (111) plane in the diamond cubic SiGe aligns to the (0001) surface of sapphire to make a shape of rhombohedral structure, where the atom positions are both similar enough that these two materials coherently match to one another on the atomic scale. By themselves, these two materials do not match at room temperature, but this can be achieved at temperatures above room temperature with thermal expansion of the bonds between atoms. This requires an intimate understanding of the thermal expansion effects and the crystal structure of both materials to determine how this bonding happens. If the substrate temperature is not correctly set, depositing Si and Ge atoms on the sapphire surface will form several crystals, leading to a useless polycrystalline film.

Conventional methods of epitaxial growth of SiGe/sapphire require high substrate temperatures (i.e., temperatures above 850° C.) and an interfacial Si layer to achieve a monocrystalline film. In conventional high temperature (i.e., temperatures above 850° C.) methods, temperatures in the 850° C.-1100° C. range must be reached and maintained at least for 4 hours in order to achieve a uniform temperature in the sapphire wafer. After this, in conventional high temperature (i.e., temperatures above 850° C.) methods, a thin (i.e, approximately 10 nm) intermediate Si layer is deposited as a strained layer to create a coherent match to the underlying atomic structure of sapphire substrate, since the lattice constant of Ge is larger than those of Si and sapphire. After this, in conventional high temperature (i.e., temperatures above 850° C.) methods, the temperature is dropped to 800° C.-900° C. for SiGe or pure Ge deposition onto the Si layer. The growth temperatures in the 850° C.-1100° C. range required for conventional high temperature (i.e., temperatures above 850° C.) methods are wholly unsuitable for practical and economical SiGe/sapphire production. The long thermal load and soak time prior to deposition of the Si intermediate layer in conventional high temperature (i.e., temperatures above 850° C.) methods is also far too time-consuming to be practical. The high temperature loading in conventional high temperature (i.e., temperatures above 850° C.) methods also leads to significant numbers of cracked wafers owing to extreme thermal stress.

The various embodiments may provide a low temperature (i.e., less than 850° C.) method of Silicon-Germanium (SiGe) on sapphire ($Al_2O_3$) (SiGe/sapphire) growth that may produce a single crystal film with less thermal loading effort to the substrate than conventional high temperature (i.e., temperatures above 850° C.) methods. The various embodiments may alleviate the thermal loading requirement of the substrate, which in conventional high temperature (i.e., temperatures above 850° C.) methods had surface temperatures within the range of 850° C. to 900° C. The various embodiments may provide a new thermal loading requirement of the sapphire substrate for growing single crystal SiGe on the sapphire substrate in the range of about 450° C. to about 500° C. The benefits of the various embodiments are substantial for cost and time savings and may result in the elimination of the time-consuming and costly high heating, long thermal soak times, and interfacial Si layer of conventional high temperature (i.e., temperatures above 850° C.) methods. In various embodiments, yield and throughput may be increased as time to production may be reduced from over 4 hours in conventional high temperature (i.e., temperatures above 850° C.) methods to less than 1 hour in the various embodiment methods. Thus, various embodiments may enable the same quality of SiGe/sapphire to be produced with far less effort and time when compared to conventional high temperature (i.e., temperatures above 850° C.) methods, bringing SiGe/sapphire fabricated according to the various embodiments to within the realm of mass production. Pure Si devices may benefit tremendously from the various embodiments, as replacing pure Si devices with SiGe/sapphire enables much higher performance without an extreme increase in cost.

Various embodiments provide SiGe/sapphire production methods that take into consideration the trigonal sapphire structure on (0001) and the manner in which SiGe film nucleates and grows. Accounting for thermal expansion effects, calculations using the SiGe/sapphire production methods according to the various embodiments show that both pure Ge and SiGe can form single crystal films in the about 450° C. to about 550° C. temperature range. Experimental results confirm that both pure Ge and SiGe can form single crystal films in the about 450° C. to about 550° C. temperature range according to the various embodiment methods, where x-ray diffraction and atomic force microscopy show the films fabricated at low temperature (i.e., temperatures below about 850° C.) according to the various embodiments rival the films produced by conventional high temperature (i.e., temperatures above 850° C.) methods in crystallographic and surface quality. Various embodiments were developed using a model for how Si and Ge bond to the (0001) sapphire surface, and then a determination as to which temperatures were the most conducive to forming coherent, single crystal thin films. Film growth at those temperatures was conducted with success for the various embodiments being measured as high (>99%) single crystallinity and a flat, terraced surface with low root-mean-square (RMS) roughness.

Thin films are often dominated by the strain state at the interface between film and substrate, dictating whether films grow in a two-dimensional fashion (layer-by-layer growth), a three-dimensional fashion (Volmer-Weber), or a hybrid fashion where growth is initially two-dimensional, then switches to a three-dimensional mound growth after a certain critical thickness (Stranski-Krastanov growth). Mound formation is a response to interfacial strain, alleviating the difference in lattice constants between film and substrate. Flat and uniform films grow layer-by-layer, requiring a low mismatch strain. Previous work with SiGe has demonstrated high crystallinity and low roughness, even in micron thick films. Hence, despite the difference in crystal structure, (111) plane SiGe atoms can align to form a coherent film on (0001) sapphire.

Interfacial strain ultimately arises from the difference in lattice constants and bulk crystal structure, not from the atomic scale of surface atom arrangement. Thus, O-terminated or Al-terminated sapphire surfaces are not the determining factor in producing single crystal SiGe. While surface atomic structure affects the bonding and chemistry of the SiGe to the substrate, the film still needs to match the underlying bulk structure to achieve a low strain condition. FIG. 1 compares the (0001) trigonal and (111) diamond cubic crystal structure planes from the top-down and side views. Specifically, FIG. 1 shows the top-down 102a and side 102b views of the trigonal sapphire surface as compared to the top-down 103a and side 103b views of diamond cubic silicon. In FIG. 1, atoms shown with patterned elements are more towards the surface than atoms illustrated by solid elements. Si atoms are closer in size and spacing to the sapphire Al atoms and will mimic those atoms most upon bonding to the sapphire surface. Both Si and Ge form diamond cubic structures; therefore, the atoms in that structure may be referred to as Si/Ge atoms, to indicate either species may occupy the lattice sites.

Figure 2:
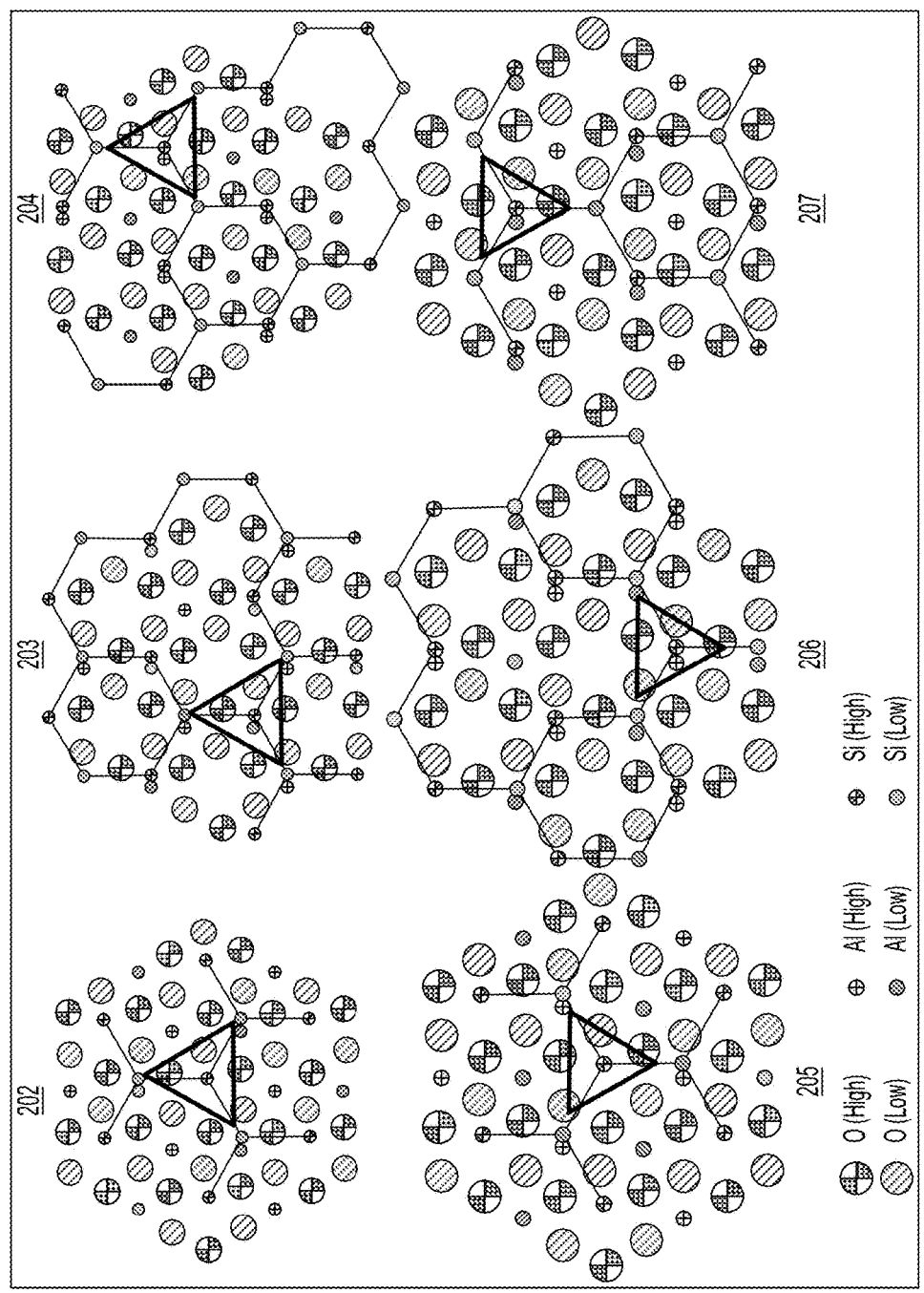
FIG. 2 shows various overlay models of (111) planes of SiGe atoms onto the (0001) sapphire plane.

FIG. 2 shows overlay models 202-207 of (111) planes of Si/Ge atoms (connected by lines) onto the (0001) sapphire plane. The triangle in each model 202, 203, 204, 205, 206, and 207 marks out the "central" Si/Ge atom. The three Si/Ge atoms bonded to this atom are the interfacial atoms that form the virtual triangle. Si/Ge atoms are shown with bonds drawn and slightly offset to the right of the sapphire Al atoms. The three possible "up" twins are reflected in models 202, 203, and 204, while the three possible "down" twins (i.e., models 205, 206, and 207) can form on the (0001) sapphire plane. In FIG. 2, the (111) Si/Ge plane most closely matches the Al double layer in the (0001) sapphire surface. Thus, Si and Ge atoms will align over the Al atoms in its bonding to the sapphire surface. For an O-terminated surface, Si will bond to three surface O atoms similar to that seen in $SiO_2$, followed by another Si atom directly over the interfacial Si atom to satisfy the four-fold Si coordination.

Unequal thermal expansion of bond lengths may be accounted for in both the substrate and the film. Related work on $CdTe/Al_2O_3$ showed substrate temperatures of 460° C. were ideal for forming single crystal $CdTe/Al_2O_3$. Below 420° C., $CdTe/Al_2O_3$ films were of poor quality, as were films grown much above 460° C., suggesting a growth temperature window where thermal expansion of the film and substrate reduces the mismatch strain low enough to achieve coherent, high-quality films. Finding the right temperature for growth is the first major challenge in producing single crystal $SiGe/Al_2O_3$ films.

The second major challenge to single crystal $SiGe/Al_2O_3$ films is twin formation. Previous $SiGe/Al_2O_3$ work showed SiGe can form two different crystallographic twins as evidenced in the XRD φ angle scans showing six {220} peaks instead of three. Often, three of the peaks are more intense, indicating a predominant major twin. Three less intense peaks from the minority twin appear at exactly 60° between the major twin peaks. Thus, the twins are crystallographically the same, but rotated 60° with respect to each other. Dominance of one twin over the other was attributed to differences in surface site activation energies for diffusion, with the dominant twin forming on atomic sites with higher activation energies.

With these observations in hand, the models 202, 203, 204, 205, 206, and 207 were constructed as shown in FIG. 2. In these models 202, 203, 204, 205, 206, and 207, the twins (i.e., models 202, 203, and 204) are arbitrarily called "up" twins. This designation arises from the fact the upper Si/Ge atoms bond to the three lower interfacial Si/Ge atoms to form a virtual triangle that points upward. When this bonding arrangement is rotated 60° within the surface plane, the triangle points downward as shown in models 205, 206, and 207. For these two valid rotations, the lower level atoms may then align over one of three types of sites: over the Al sites closer to the surface, over the Al atoms further from the surface, and the "blank" sites, that is, the sites where Al atoms are much further into the sapphire crystal. Hence, six possible configurations are possible, three for each twin. Each is incompatible with the other, and will form twin boundaries if one or more nucleate on the sapphire surface during growth. However, of the three up twins, one site type will be energetically preferable to the other two. Any incoming atoms in the higher energy sites will diffuse out of those sites into the lowest energy ones. A similar argument holds for the down twins, reducing the total number of relevant twin configurations to two. Which sites are energetically preferred is unknown, requiring nudged elastic band density functional theory simulations to accurately calculate the activation energies. However, this does not affect the final result as the three different sapphire sites are the same distance apart. The thermal strain on the SiGe film will be the same regardless of which sites are energetically most favorable. Whichever particular configuration is lowest in energy, it results in the same lower temperature single crystal $SiGe/Al_2O_3$ growth.

The calculation of the ideal temperature for forming single crystal $SiGe/Al_2O_3$ was considered. Comparing the (111) SiGe plane to the (0001) $Al_2O_3$ plane, the interfacial (111) plane atoms most closely match the spacing between the top-most Al atoms in (0001) $Al_2O_3$. The assumption here was when the SiGe spacing matches the Al spacing, the film was coherent, forming a stable rhombohedral crystal structure. All simulated film atom coordinates were extrapolated from the diamond cubic unit cell, using linear interpolation of bond spacing and lattice constants for mixed SiGe alloy films. From this, two parameters were defined: bond angle distortion and bond length distortion.

The first parameter, bond angle distortion, represented the level of extension or compression of the cubic unit cell along its body diagonal. As either happens, the unit cell deviated from its cubic shape to form a rhombohedral unit cell, where the corner angles were no longer 90°. An elongation along the body diagonal, defined as a positive bond angle distortion, contracted the atoms in the (111) plane together and distended them in the direction normal to the (111) plane; a compression along the body diagonal, defined as a negative bond angle distortion, had the reverse effect. The second parameter, bond length distortion, was defined as a multiplier on the unit cell lattice constant. Values between 0 and 1 represented a contraction of the bond lengths, while any value greater than 1 represented a bond length extension.

Running this comparison for bond angle values from −0.50 to 0.50 and bond length multipliers from 0.01 to 2, it became apparent these parameters were not independent. Only certain combinations of these two parameters were even capable of matching the film to the substrate at any temperature. This is not surprising as an increase in the length multiplier can have the opposite effect of the contraction caused by an increase in bond angle distortion. Fitting a $4^{th}$ order polynomial to these parameters, the bond length multiplier needed to match the film to the substrate for any given bond angle distortion may be predictable. This reduces the distortion necessary to match SiGe to $Al_2O_3$ to a single parameter. Unit cells for SiGe were constructed for each combination of the angle and bond length distortion parameters, representing the hypothetical film crystal structure at room temperature. The thermal expansion for both the film and $Al_2O_3$ substrate were calculated for the temperature range of 20° C. to 1250° C. At each temperature, the (111) plane SiGe interfacial atom spacings were compared to the (0001) Al atom spacing in $Al_2O_3$, and if the difference between the two was within 0.0001 angstroms, the film was declared a match to the substrate.

Figure 3:
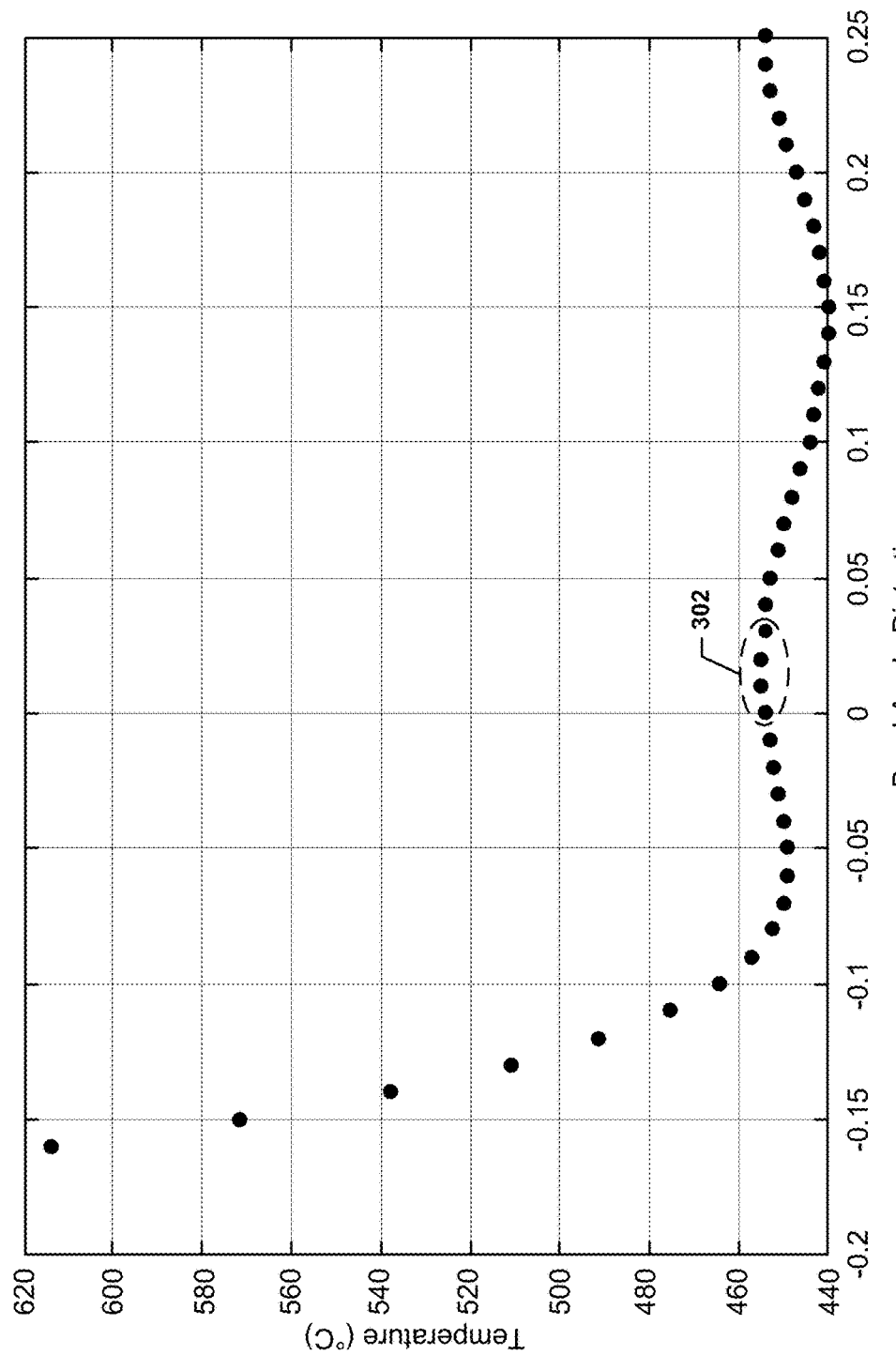
FIG. 3 is a graph of temperature versus bond angle distortion for SiGe.

The proposed lower temperatures were calculated with simulation of several possible SiGe crystal structures that might match to the $Al_2O_3$ substrate. The best matches were then run with simulated thermal expansion to identify where they matched to the $Al_2O_3$ crystal (0001) surface. FIG. 3 shows the temperatures where SiGe matches $Al_2O_3$ vs. the bond angle distortion parameter, a measure of different SiGe crystals. The lowest temperatures for matching were determined at the marginally stable point without much distortion of bond angle (i.e., the temperatures highlighted by the circle 302 in FIG. 3). Local minima in these curves (circled) indicate the lowest temperatures of matching, corresponding to where the lattice mismatch and subsequent film strain are minimized and thus which SiGe crystal structure forms. Based on the simulations, Ge forms a strong match around 450° C. and $Si_{0.15}Ge_{0.85}$ does the same around 500° C. These are the wafer surface temperatures; in actual experiments the reported growth temperature is from a thermocouple that sits beneath the wafer plate. Thus, the experimental setpoint was higher than the matching temperature to account for differences in reported thermocouple temperature and actual wafer surface temperature. The range of about 450° C. to about 500° C. was then confirmed experimentally.

Figure 4:
FIG. 4 shows photographs of two embodiment SiGe/sapphire wafers.

Two SiGe/sapphire wafers grown at 450° C. and 500° C. were found to be of high quality, on par with those produced by conventional high temperature (i.e., temperatures above 850° C.) methods. Example experimental SiGe/sapphire wafers are shown in FIG. 4, both of which show a high reflectivity and no discoloration that indicate the formation of high quality films. Typically, faded coloration appears in low quality films. FIG. 4 shows a photograph of a SiGe/$Al_2O_3$ wafer produced at 450° C. labeled 402 and a SiGe/$Al_2O_3$ wafer produced at 500° C. labeled 404 on which both show the reflected images of laboratory ceiling tile.

The experiments were done in a SRN-150 magnetron sputtering system. 50 mm sapphire wafers, oriented to the (0001) plane as the epitaxial growth surface, were loaded on a Mo holder plate, with the epi-ready side facing upward. 175 mm Si and Ge targets facing downward were used to sputter thin films onto the sapphire wafer substrate. Ar was used as the sputtering plasma, held at a constant pressure of 5 mtorr during growth and at a flow rate of 50 sccm. Substrate temperatures ranging from 400° C. to 560° C. were achieved with the radiative heating from a quartz heater bulb assembly, consisting of six bulbs beneath the wafer holder plate. The temperature was measured by a thermocouple in the center of the assembly.

Film thicknesses and composition were estimated from a series of calibration samples. Pure Si or pure Ge films were deposited on a series of wafers at 550° C. at radio-frequency (RF) discharge plasma of Si or direct current (DC) discharge plasma of Ge with powers ranging from 100-800 W, and all depositions were 1 hour long. The resulting wafers were removed, cleaved, and the cross-sectional film thickness measured with a JEOL 6360 scanning electron microscope. Using the time of sputtering process and the film thickness, the sputtering rates were easily obtained. With the resulting thicknesses at each sputtering power, the SiGe film thicknesses were taken to be the addition of the Si and Ge thicknesses. With this in hand, the SiGe compositions were estimated as the ratio of individual Si and Ge thicknesses to the combined SiGe thickness. A SiGe film has two requirements for use in device fabrication. First, it must be a monocrystalline film; that is, one twin must be dominantly oriented and comprise 99% or more of the film. Second, the surface must have a flat, terraced morphology. X-ray diffraction (XRD) and atomic force microscope (AFM) methods were used to establish these two qualities in each film. All films were scanned with a Panalytical X'Pert Pro XRD system along the 2θ-ω and φ axes and in a XY area map at a constant goniometer position. The 2θ-ω scans were done from 5-120° to establish overall film quality through measurement of the full-width at half-maximum (FWHM) and peak intensity. The φ axis is parallel with the (111) SiGe surface normal, and each scan completed one whole revolution of the wafer at a constant position designed to find all the {220} reflections. A similar φ scan is done with the sapphire (0001), parallel with the (111) SiGe surface, to find all the {10$\bar{1}$4} reflections. A high quality SiGe film will have three peaks in the SiGe scan, corresponding to the three {220} planes in the film. The presence of six peaks, 60° offset from one another, corresponds to two twins, rotated 60° with respect to one another, each with three {220} reflections. Relative peak heights of these twins are compared to determine how much of each twin exists in the SiGe film. Finally, two XY area maps of a (220) reflection, one for each twin, were done to find the distribution of both twins over the film, whether they are evenly distributed or segregated. This was done after the φ scan when the φ angle positions were known. Setting the goniometer to one of these positions led to a constant illumination of that (220) plane, mapping the location of that twin over the whole wafer as the XY scan proceeded. Surface film quality was established with a Quesant Q-scope AFM. Scans 10×10 μm² in size were taken at the center of each wafer and the root-mean-square (RMS) roughness calculated over the whole image. Rough films tended to have rounded mounds on the surface, while better films showed flatter, terraced surfaces.

FIGS. 5A-D show X-ray diffraction (XRD) data of the 450° C. SiGe/$Al_2O_3$ wafer and FIGS. 6A-D show XRD data of the 500° C. SiGe/sapphire wafer, respectively.

Figure 5A:
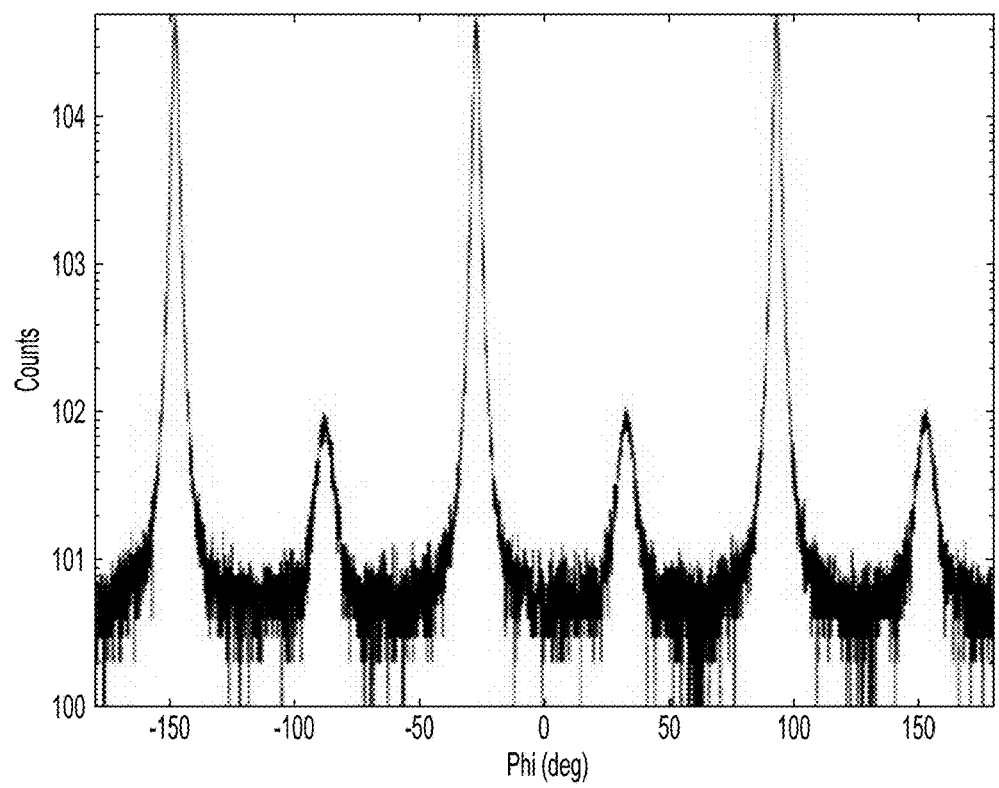
FIGS. 5A-5D illustrate various XRD data of an embodiment SiGe/sapphire wafer.
Figure 5B:
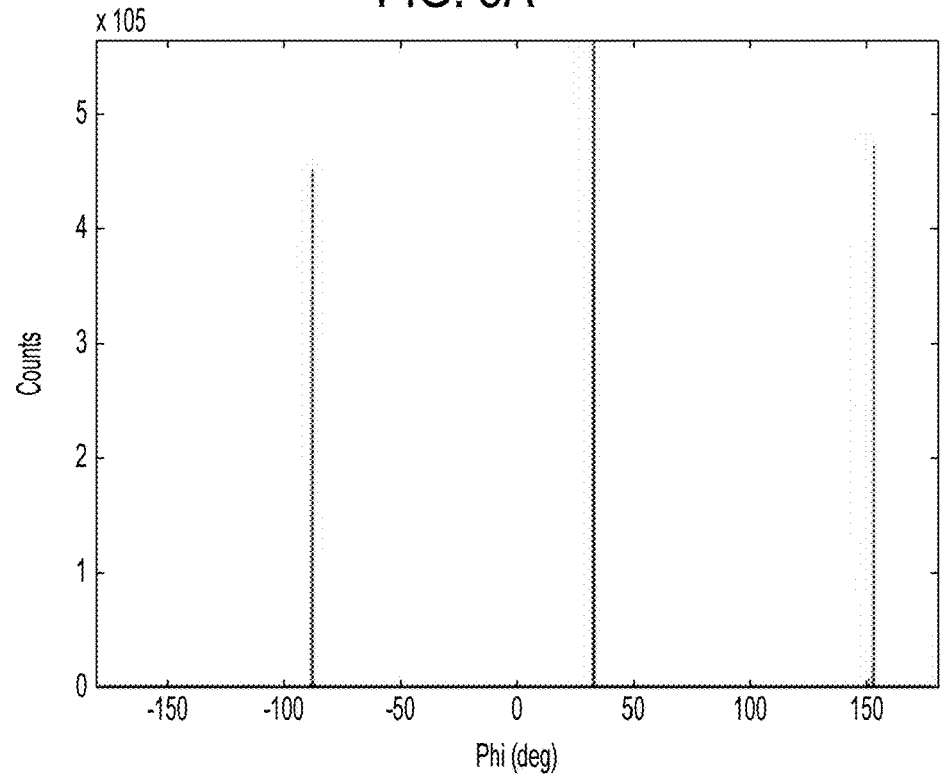
Figure 5C:
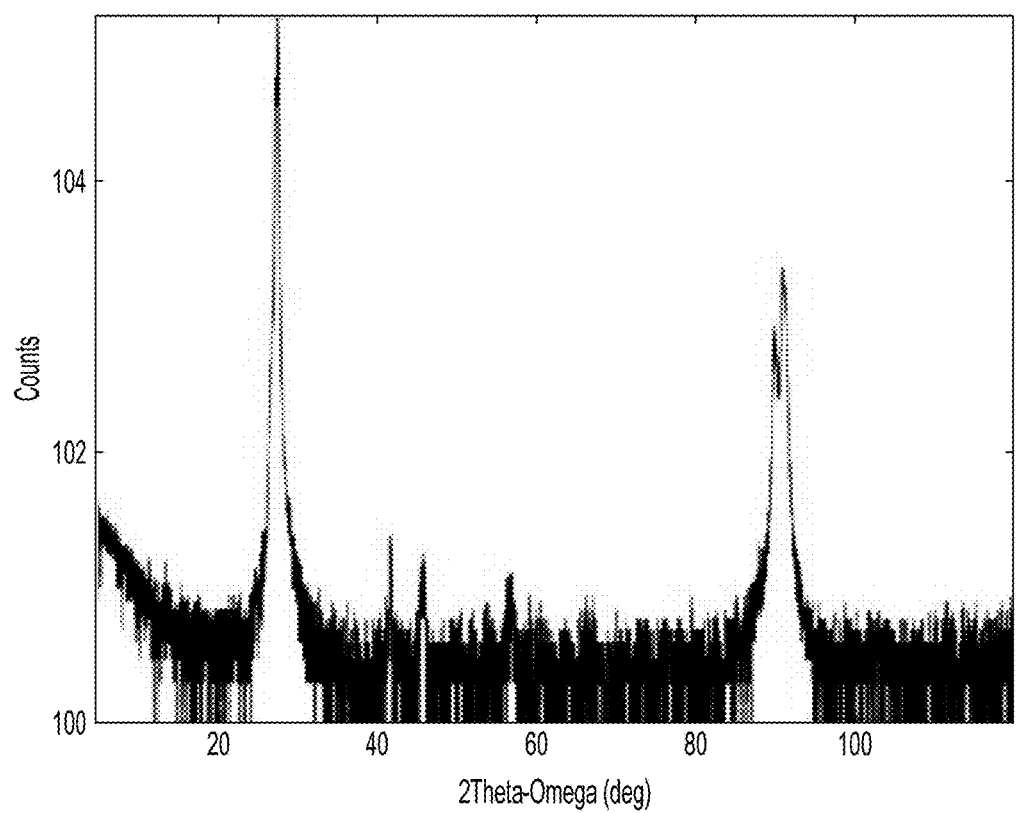
Figure 5D:
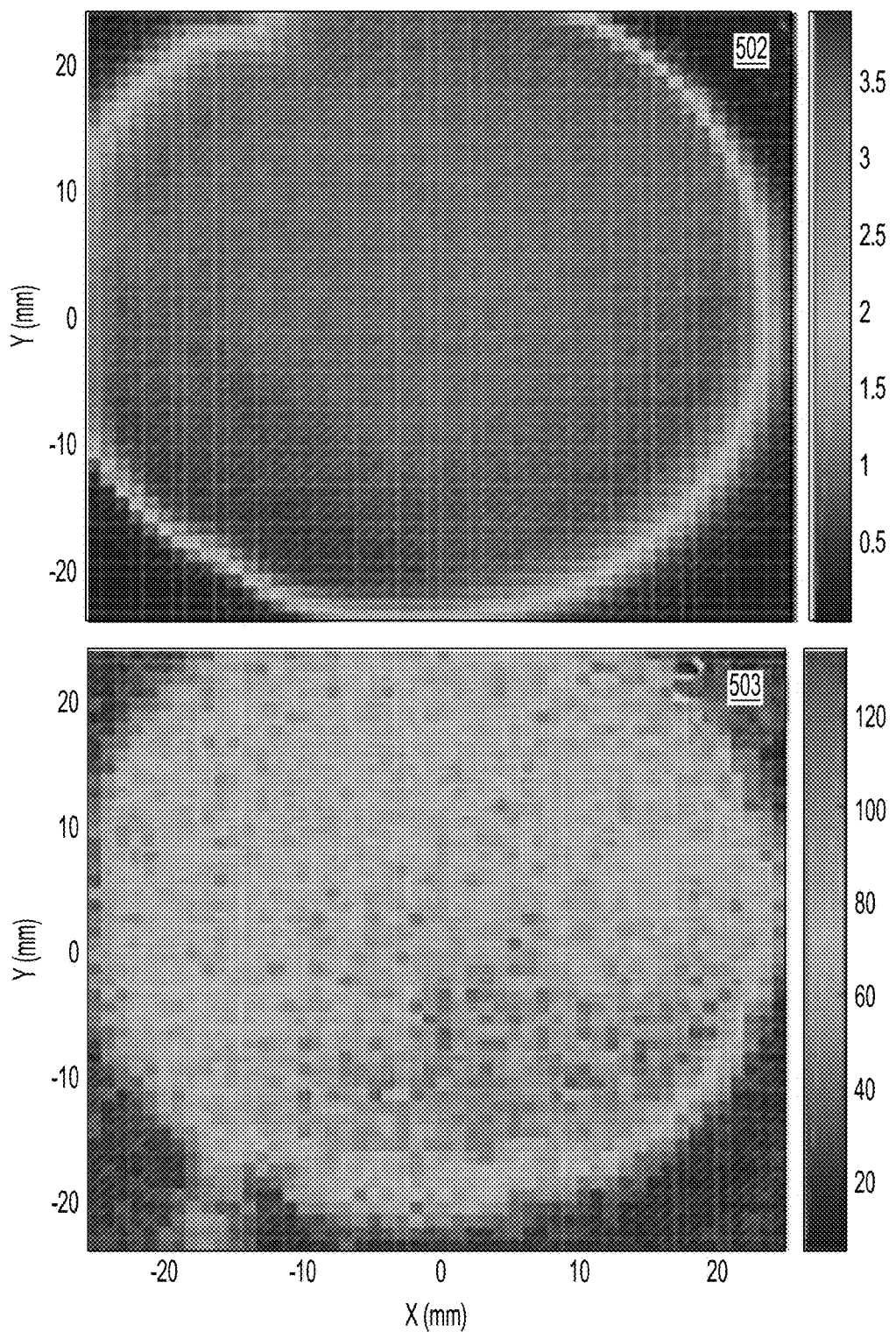

FIG. 5A illustrates a graph of the counts of {220} reflections when rotating the phi axis normal to the wafer surface for the 450° C. SiGe/$Al_2O_3$ wafer and indicates that one twin dominates over the other, occupying 99% of the film. FIG. 5B shows {10-14} reflections of the underlying sapphire substrate, which aligns with the minor twin {220} reflections, showing the coherence between the film and substrate. FIG. 5C shows the results of the 2theta-omega scan showing high film quality with a sharp, intense peak at 27° corresponding to the SiGe film. FIG. 5D illustrates wafer maps of a major twin (220) reflection (labeled 502) and a minor twin (220) reflection (labeled 503) that show the dominance of the one twin is largely uniform.

Figure 6A:
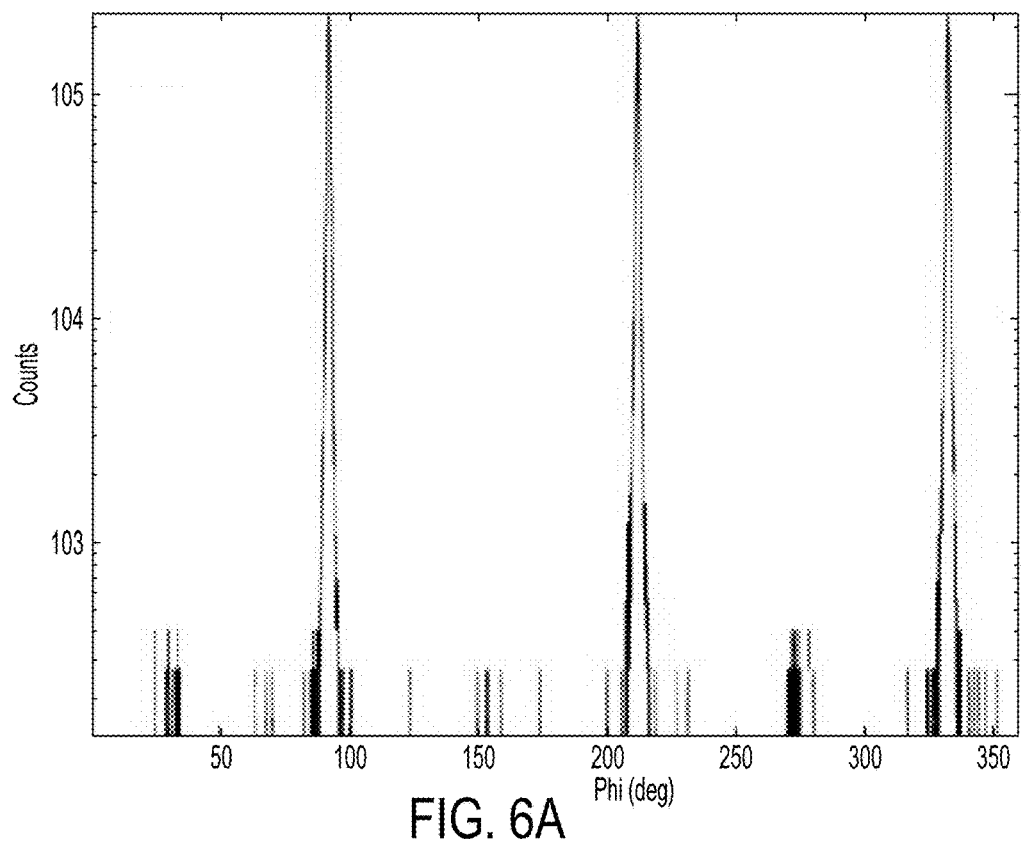
FIGS. 6A-6D illustrate various XRD data of an embodiment SiGe/sapphire wafer.
Figure 6B:
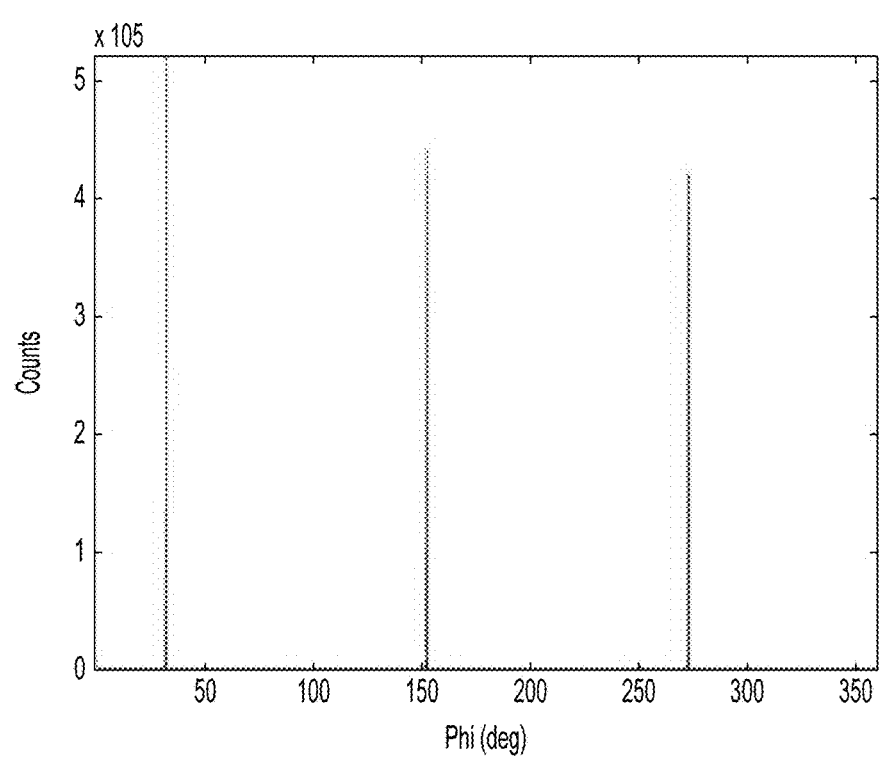
Figure 6C:
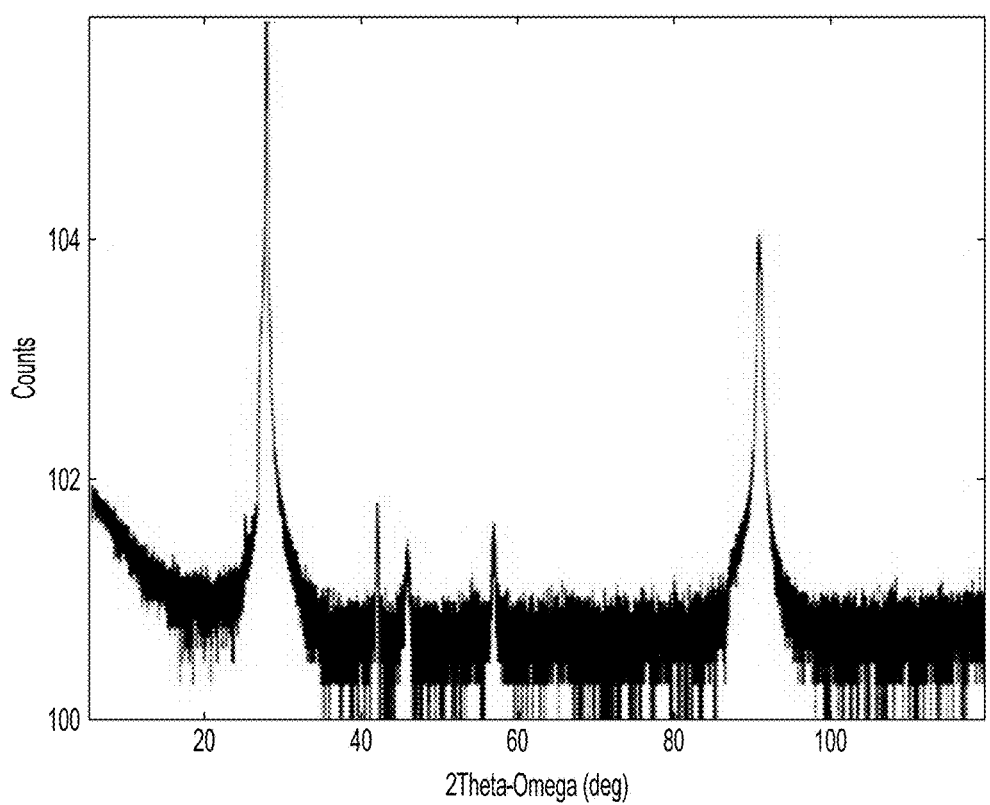
Figure 6D:
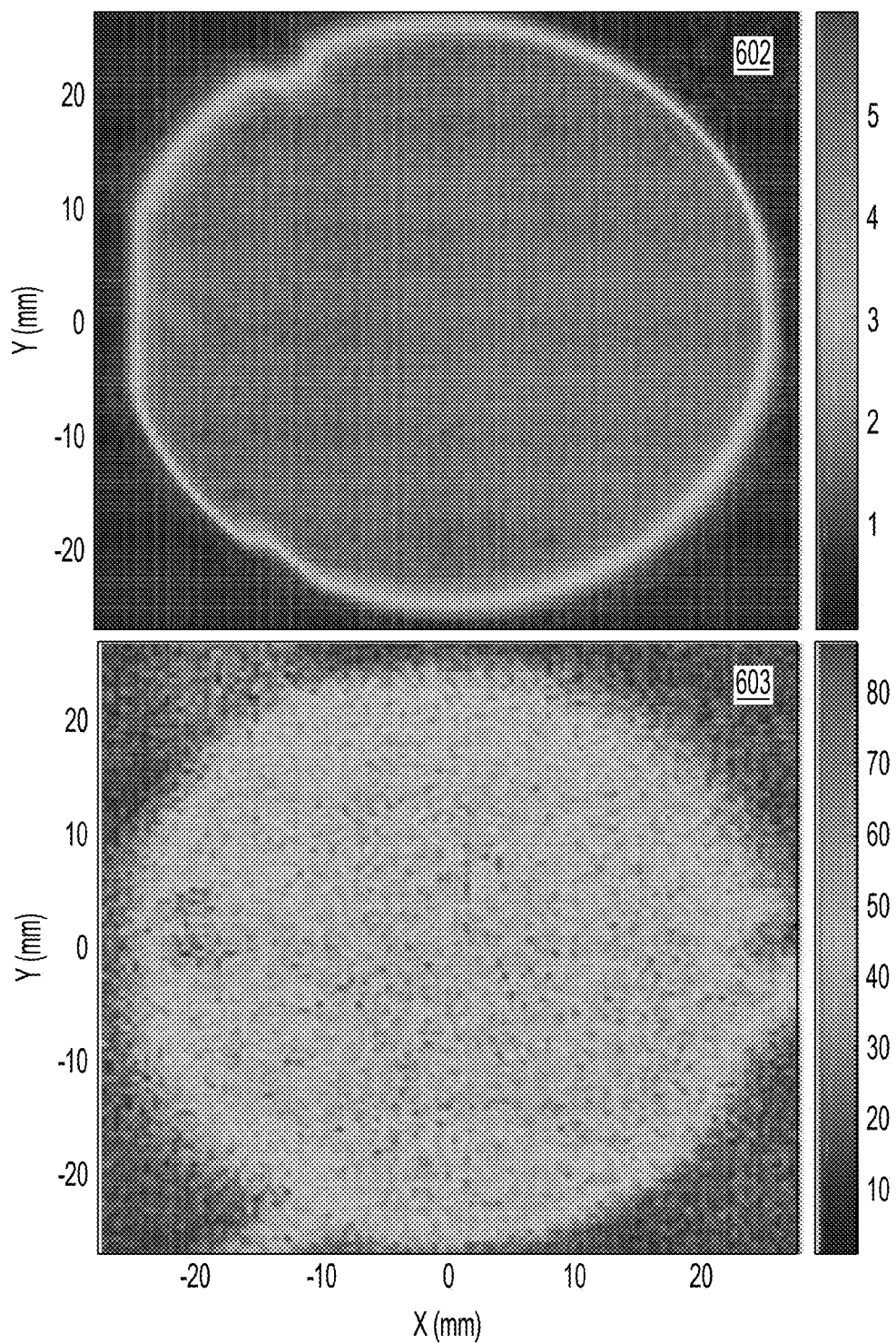

FIG. 6A illustrates a graph of the counts of {220} reflections when rotating the phi axis normal to the wafer surface for the 500° C. SiGe/$Al_2O_3$ wafer and indicates that one twin dominates over the other, even more so than in the 450° C. case, occupying over 99.9% of the film. FIG. 6B shows {10-14} reflections of the underlying sapphire substrate, showing the same coherence as before. FIG. 6C shows the results of the 2theta-omega scan showing an even more intense peak at 27°. FIG. 6D illustrates wafer maps of a major twin (220) reflection (labeled 602) and a minor twin (220) reflection (labeled 603) that show the same dominance of the one twin.

The XRD data shows the films are 99% single crystal or better. The remainder is known as the minor twin, arising from a 60° rotation of the major, dominant twin. No other SiGe films have been observed to form. The remaining data for both wafers show high reflected intensity and narrow peaks in the 2θ-ω scans and uniform coverage in the wafer maps, all indicative of wafers usable for semiconductor device manufacturing.

Figure 7:
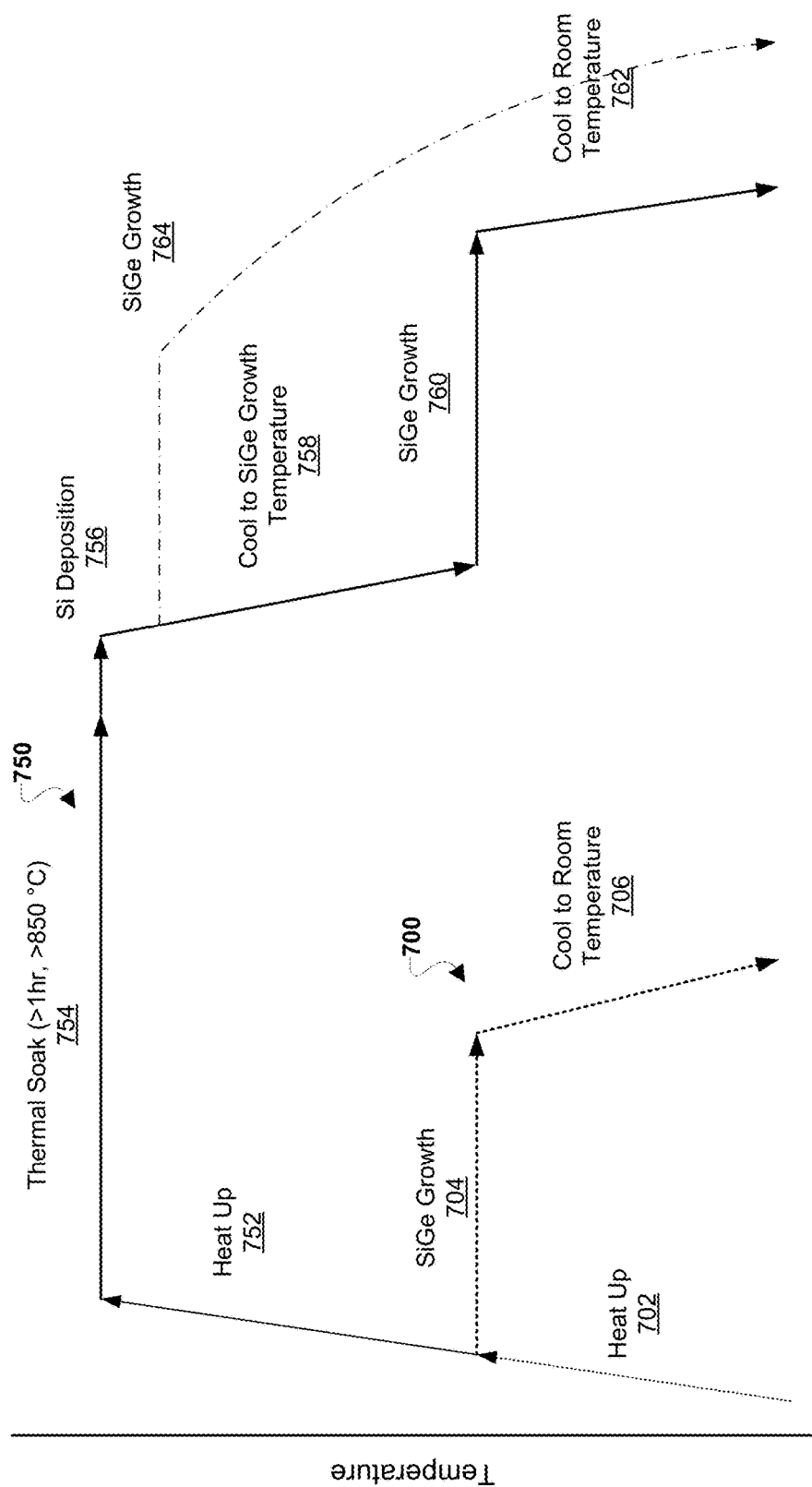
FIG. 7 is a process flow diagram illustrating a comparison between an embodiment SiGe/sapphire growth method and conventional methods.

FIG. 7 is a process flow diagram illustrating a comparison between an embodiment SiGe/sapphire growth method 700 and a conventional high temperature (i.e., temperatures above 850° C.) growth method 750.

In the conventional high temperature (i.e., temperatures above 850° C.) growth method 750, the sapphire wafer is heated up to a temperature greater than 850° C. in step 752 and thermally soaked for more than one hour at greater than 850° C. in step 754. In the conventional high temperature (i.e., temperatures above 850° C.) growth method 750, a Si layer is deposited on the sapphire wafer in step 756, and the wafer is then allowed to cool to SiGe growth temperature in step 758. In the conventional high temperature (i.e., temperatures above 850° C.) growth method 750 that SiGe growth temperature can be 890° C. in a combined SiGe growth and cooling step 764 or can be a lower temperature in step 760 followed by a cooling to room temperature step 762.

In the embodiment SiGe/sapphire growth method 700 the sapphire wafer is heated up to a wafer surface temperature ranging from about 450° C. to about 500° C., such as about 450° C., about 450° C. to about 500° C., about 500° C., etc., in step 702. SiGe growth is performed at a wafer surface temperature ranging from about 450° C. to about 500° C., such as about 450° C., about 450° C. to about 500° C., about 500° C., etc., in step 704. The SiGe growth in step 704 may specifically be the growth of mono-crystalline SiGe structures. SiGe growth may be performed for less than 1 hour in step 704. The SiGe growth in step 704 may be performed using any epitaxial growth vacuum system, such as sputtering systems, molecular beam epitaxy (MBE) systems, metallo-organic chemical vapor deposition (MOCVD) systems, etc. For example, SiGe growth may be performed by sputtering thin films of Si and Ge onto the sapphire wafer substrate. Ar may be used as a processing gas for the sputtering plasma, held at a constant pressure of 5 mtorr during growth and at a flow rate of 50 sccm. The operations performed in step 704 may result in the growth of SiGe structures on a surface of the sapphire wafer. In step 706 the SiGe/sapphire wafer (i.e., the sapphire wafer with SiGe structures on a surface) is cooled to room temperature. In various embodiments, the SiGe/sapphire wafer formed according to the operations of embodiment SiGe/sapphire growth method 700 may be used to form layers of a semiconducting device having a SiGe layer and a sapphire layer.

By comparison an embodiment SiGe/sapphire growth method 700 requires far less energy and time to produce the same quality film in half the number of steps as the conventional high temperature (i.e., temperatures above 850° C.) growth method 750. As the comparison of the embodiment SiGe/sapphire growth method 700 and conventional high temperature (i.e., temperatures above 850° C.) growth method 750 in FIG. 7 shows, in the embodiment SiGe/ sapphire growth method 700 the sapphire wafer may not be heated to a temperature above 500° C. As the comparison of the embodiment SiGe/sapphire growth method 700 and conventional high temperature (i.e., temperatures above 850° C.) growth method 750 in FIG. 7 shows, in the embodiment SiGe/sapphire growth method 700, no thermal soak time may be needed, rather in method 700 SiGe growth may occur immediately following an initial heating step. As the comparison of the embodiment SiGe/sapphire growth method 700 and conventional high temperature (i.e., temperatures above 850° C.) growth method 750 in FIG. 7 shows, in the embodiment SiGe/sapphire growth method 700 the time to heat the sapphire wafer, grow the SiGe structures, and cool the resulting SiGe/sapphire wafer may be less than the thermal soak needed in the conventional high temperature (i.e., temperatures above 850° C.) growth method 750. As the comparison of the embodiment SiGe/ sapphire growth method 700 and conventional high temperature (i.e., temperatures above 850° C.) growth method 750 in FIG. 7 shows, in the embodiment SiGe/sapphire growth method 700 a separate silicon (Si) layer is not deposited on the sapphire wafer prior to the growing of the SiGe structures in step 704.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method of growing a Silicon-Germanium (SiGe) layer on a sapphire ($Al_2O_3$) wafer, comprising:
   providing a sapphire wafer;
   heating the sapphire wafer to a wafer surface temperature at or below about 500° C.;
   growing mono-crystalline SiGe on the sapphire wafer at the wafer surface temperature thereby forming a SiGe/sapphire wafer including a SiGe layer and an $Al_2O_3$ substrate; and
   cooling the SiGe/sapphire wafer.

2. The method of claim 1, wherein heating, growing, and cooling is completed in less than one hour.

3. The method of claim 2, wherein the growing occurs immediately after the heating without a thermal soak step.

4. The method of claim 3, wherein a separate silicon (Si) layer is not deposited on the sapphire wafer prior to the growing.

5. The method of claim 4, wherein the wafer surface temperature is about 500° C.

6. The method of claim 4, wherein the wafer surface temperature is about 450° C.

7. The method of claim 4, wherein the wafer surface temperature is about 450° C. to about 500° C.

8. The method of claim 1, wherein the wafer surface temperature is about 500° C.

9. The method of claim 1, wherein the wafer surface temperature is about 450° C.

10. The method of claim 1, wherein the wafer surface temperature is about 450° C. to about 500° C.

11. A semiconductor device, comprising:
 a Silicon-Germanium (SiGe) layer and a sapphire ($Al_2O_3$) layer substrate, wherein the layers are formed by:
  providing a sapphire wafer;
  heating the sapphire wafer to a wafer surface temperature at or below about 500° C.;
  growing mono-crystalline SiGe on the sapphire wafer at the wafer surface temperature thereby forming a SiGe/sapphire wafer including a SiGe layer and an $Al_2O_2$ substrate; and
  cooling the SiGe/sapphire wafer.

12. The semiconductor device of claim 11, wherein heating, growing, and cooling is completed in less than one hour.

13. The semiconductor device of claim 12, wherein the growing occurs immediately after the heating without a thermal soak step.

14. The semiconductor device of claim 13, wherein a separate silicon (Si) layer is not deposited on the sapphire wafer prior to the growing.

15. The semiconductor device of claim 11, wherein the wafer surface temperature is about 500° C.

16. The semiconductor device of claim 11, wherein the wafer surface temperature is about 450° C.

17. The method of claim 11, wherein the wafer surface temperature is about 450° C. to about 500° C.

18. The method of claim 14, wherein the wafer surface temperature is about 500° C.

19. The method of claim 14, wherein the wafer surface temperature is about 450° C.

20. The method of claim 14, wherein the wafer surface temperature is about 450° C. to about 500° C.

\* \* \* \* \*